United States Patent [19]
Boers

[11] Patent Number: 5,302,960
[45] Date of Patent: Apr. 12, 1994

[54] MULTI-ELEMENT SUSCEPTIBILITY ROOM

[75] Inventor: Peter Boers, Marlboro, Mass.

[73] Assignee: Digital Equipment Corporation, Maynard, Mass.

[21] Appl. No.: 916,459

[22] Filed: Jul. 20, 1992

[51] Int. Cl.⁵ .......................... H01Q 3/22; G01S 4/40
[52] U.S. Cl. ..................... 342/372; 342/170
[58] Field of Search ............. 342/372, 360, 350, 464, 342/168, 170; 343/703; 340/552; 324/627

[56] References Cited

U.S. PATENT DOCUMENTS

| | | | |
|---|---|---|---|
| 3,806,943 | 4/1974 | Holloway | 343/703 |
| 4,091,327 | 5/1978 | Larsen et al. | 343/703 |
| 4,232,319 | 11/1980 | Fusinski | 343/703 |
| 4,255,750 | 3/1981 | Riley | 343/703 |
| 4,454,513 | 6/1984 | Russell | 434/2 |
| 4,797,681 | 1/1989 | Kaplan et al. | 343/786 |
| 4,837,581 | 6/1989 | Hansen et al. | 343/703 |
| 4,864,315 | 9/1989 | Mohuchy | 343/703 |
| 4,906,998 | 3/1990 | Shibuya | 342/165 |
| 4,939,446 | 7/1990 | Rogers | 324/627 |
| 4,983,981 | 1/1991 | Feldman | 342/372 |
| 5,001,494 | 3/1991 | Dorman et al. | 343/703 |
| 5,093,667 | 3/1992 | Andricos | 342/372 |
| 5,153,524 | 10/1992 | McCormack | 324/627 |
| 5,162,803 | 11/1992 | Chen | 342/372 |
| 5,184,140 | 2/1993 | Hariu et al. | 342/372 |

FOREIGN PATENT DOCUMENTS 0019874 2/1984 Japan ................... 324/627

OTHER PUBLICATIONS

Signetics RF Communications, Data Sheets for Single pole double throw (SPTDT) switch, No. NE/SA630, Oct. 10, 1991.
Signetics RF Communications, Data Sheets for Wideband variable gain amplifier, No. NE/SA5209, Aug. 20, 1990.
Antenna Engineering Handbook, Henry Jasik, 1st Ed., pp. 2-3-2-7.

Primary Examiner—Gregory C. Issing
Attorney, Agent, or Firm—Albert P. Cefalo; Dirk Brinkman

[57] ABSTRACT

An apparatus is disclosed for testing the immunity of an electronic device to interfering electromagnetic radiation. The apparatus includes a room enclosing a bounded space for containing the electronic device to be tested and a plurality of radiating elements disposed on the interior surfaces of the room for generating an electromagnetic field in the room. Each of the radiating elements includes a controllable phase shifter, a controllable amplifier, and antenna. The circuits of the phase shifter and amplifier are connected by a common signal bus to a radio-frequency signal source and by a common control bus to a controller for individually adjusting the phase and amplitude of the radiated signal to create an electromagnetic field within the room having a predetermined strength and distribution.

7 Claims, 4 Drawing Sheets

MULTI-ELEMENT SUSCEPTIBILITY ROOM

FIELD OF THE INVENTION

This invention is concerned with testing the immunity of an electronic device to radiated energy, and more particularly to a susceptibility room for subjecting an electronic device to a predetermined radio-frequency field.

BACKGROUND OF THE INVENTION

An electronic device, such as a computer system, may experience serious operating difficulties in the presence of unintended radio-frequency fields. Such fields, which interfere with the normal operation of the device, are generally known as electromagnetic interference ("EMI"). Numerous techniques, which generally increase the manufacturing cost of the device, are used to ensure that normal operation of the electronic device is not compromised.

For example, some immunity to EMI may be provided by mounting the electronic devices inside a shielded enclosure known as a Faraday cage. Such an enclosure is usually constructed with special conductive gaskets which electrically join the access panels of the enclosure which are particularly disposed to unintended electromagnetic leakage. In addition, the electrical cables of the device, which join the device with other equipment and power sources, must be designed with specialized EMI filters. EMI shields and filters may provide some immunity to unintended electromagnetic noise, however, it is not always technically possible or economically practical to design a device with total immunity to EMI.

Therefore, it is necessary to measure to what extent the operation of an electronic device is effected by residual EMI. In order to determine the susceptibility of the device to EMI, the device must be subjected to field strengths which are representative of the ambient environments in which it will be operated. The test fields to which the device is subjected should be predictable so that the level of radiation is determinable to a high degree of certainty.

EMI susceptibility testing is typically performed inside an enclosed space or "screen room" which has good electrical isolation from external radiation. Notwithstanding the electrical isolation of the screen room, serious measurement problems and errors can still result due to the electrical conductivity and reflectivity of the walls of the room which set up standing waves which may interfere with the fields being measured.

In order to minimize these measurement problems, anechoic screen rooms for measurements at frequencies of a few megahertz have been constructed underground, in caves or in tunnels. The nonmetallic, lossy and irregular walls of the room reduce reflection and attenuate fields which may interfere with the testing measures. However, access to naturally occurring screen rooms may not always be readily available and geological considerations may otherwise decide against the economical construction of such an underground screen room.

In another technique, the device to be tested is placed inside a transverse electromagnetic transmission (TEM) cell which has a known uniform transverse electromagnetic field. However, since the device to be tested must be placed entirely within the cell, the size of the device that can be tested in a TEM is considerably reduced as a function of the cell size.

Alternatively, susceptibility testing is performed in an anechoic chamber. An anechoic chamber is typically a screen room constructed with walls that absorb or attenuate reflected electromagnetic radiation. In one such construction, the walls are covered with a material which has an impedance of about 377 ohms per meter, the characteristic impedance of free space and spaced at one-quarter wavelength from a reflecting wall, a so called quarter wave or Salisbury screen. In such a screen room electromagnetic reflection is prevented by a mechanism of destructive interference. Due to the need to space the screen by one quarter wavelength from the wall, this technique only provides the desired attenuation within a narrow frequency band. More complex structures can be created, at a far greater cost, by placing a plurality of sheets, having varying direct current resistivities, in the range of about 40 to 2,000 ohms, at different distances from the reflecting surfaces. Broadband electromagnetic attenuating materials, which are sometimes used in stealth technologies, are effective for a wider range of electromagnetic frequencies, however such materials are relatively expensive and not always practical for industrial applications.

An anechoic screen room can also be constructed by placing numerous three dimensional absorbing structures inside the room. Typically, the absorbers, each of which has the shape of a triangular pyramid or serrated cone (deformed triangular pyramid) are attached to the walls, ceiling and floor of the room. To effectively absorb electromagnetic radiation in the range of about 30 to 1000 megahertz (a wave length range of about 10 meters to 0.3 meters) the cones need to have sizes set to a value from approximately one-quarter of the maximum wavelength. In other words, cones for absorbing waves in the radio-frequency spectrum can be as large as 2.5 meters. Rooms constructed in this manner for susceptibility testing of large electronic devices, such as complete computer systems, tend to be voluminous and expensive.

Yet another technique requires that a screen room be constructed with ellipsoidal (egg-shaped) reflecting walls. The inner surfaces of the metallic walls define a closed space with two focal points. A source of radio-frequency radiation is placed at a first focal point and a spherical (ball) shaped absorbing structure is disposed at a second focal point. The device to be tested is placed between the two focal points to receive direct radiation from the source at the first focal point. Any waves reflected at the inner surfaces of the walls are directed primarily at the absorbing second focal point thus reducing secondary reflections and resonance within the testing room.

Although some of these techniques partially address the control of the electromagnetic environment within the screen room, the construction of rooms using these and other conventional techniques is generally expensive. In addition, these techniques do not readily permit the simultaneous and rapid adjustment of the phase and amplitude of the radiation to create a variety of field impedances for wide spectrum EMI susceptibility testing. In addition, anechoic rooms with a single point source radiating element generally require high-power amplifiers and its known that point sources create non-linear (inconsistent amplitude over varying distances) fields, which may not be representative of actual ambient operating conditions being modeled.

Therefore, it is desirable to provide an apparatus for susceptibility testing of an electronic device which generates uniform and predictable radio-frequency fields at a relatively low cost. It is also desirable that these fields be adjustable for phase and amplitude distortions over a wide range of field impedances. It also desirable that high flux fields be obtainable without the use of high power generators and amplifiers.

SUMMARY OF THE INVENTION

In accordance with the invention, there is provided an apparatus for subjecting an electronic device to radio-frequency noise or electromagnetic interference (EMI). In one embodiment of the invention, the apparatus includes a susceptibility room having a plurality of active field radiating elements, for example hundreds, positioned on the interior surfaces thereof. Each of the radiating elements comprises a phase shifter, an amplifier, and an antenna. The antenna is, for example, part of an etched area of a generally rectangular printed circuit board on which the phase shifter and the amplifier are arranged. The phase shifter is controllable for phase lead and the amplifier is controllable for gain.

A signal generator, which is coupled to the radiating elements by a signal bus, defines the time-domain waveshape of the input signal common to all radiating elements. The controller, for example a computer, coupled to the radiating elements by a control bus, defines individually for each of the radiating elements by means of, for example, pre-stored control signals, the relative amplitude and phase of the radiated signal for each of the radiating elements. By individually controlling the radio-frequency signal emitted by each of the radiating elements a predetermined field boundary condition is created at the periphery of the bounded spaced defined by the radiating elements.

During operation of the multi-element susceptibility room an electronic device to be tested for immunity to radio-frequency noise or EMI is placed in the room. A radio-frequency signal of a predetermined frequency is provided by the signal generator and distributed over the signal bus to all of the radiating elements. Gain control signals and phase control signals, generated by the controller, are transmitted over the control bus to the amplifier and phase shifter of each radiating element. Gain control signals selectively adjust the gain of each individual amplifier. The phase control signals adjust the lead of each individual phase shifter. The adjusted radio-frequency signal of each of the radiating elements is dissipated by the antenna to create a predetermined radio-frequency field within the room. The field patterns thus generated in the susceptibility room can be made approximately representative of the environment, for example, a far-field region, in which the device under test is intended to be used.

The apparatus, in accordance with the invention, allows a much greater precision in immunity testing than previously practicable with conventional techniques. The multi-element susceptibility room can be constructed with low power, low cost components to simulate numerous EMI conditions over a broad spectrum of frequencies and field gradients.

DETAILED DESCRIPTION OF THE PREFERRED EMBODIMENT

Figure 1:
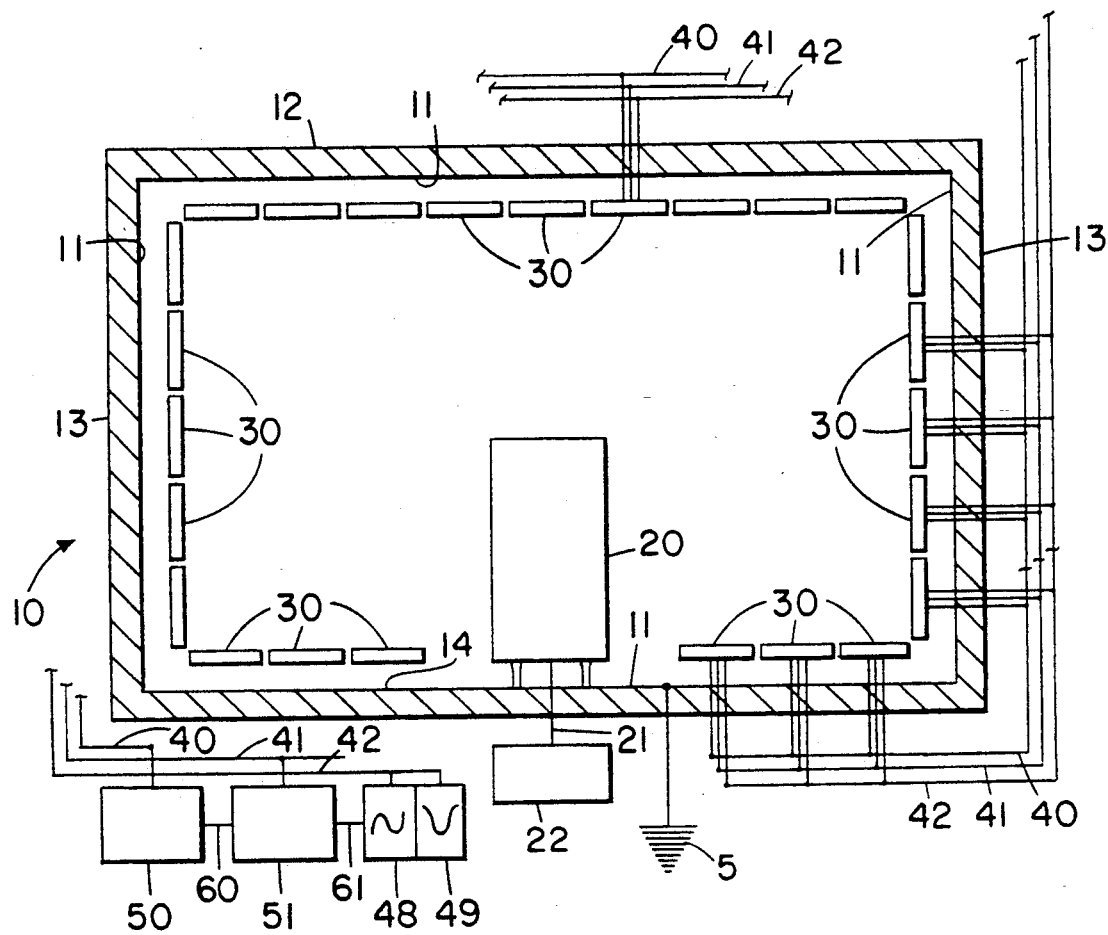
FIG. 1 is a partly diagrammatic sectioned front elevated view of a multi-element susceptibility room according to the invention.

Referring now to the drawings, FIG. 1 shows a multi-element susceptibility room 10 for determining the immunity of an electronic device 20 to radio-frequency noise or electromagnetic interference (EMI). The room 10 is made large enough to contain the electronic device 20, for example a computer system, and to provide convenient access thereto. The room 10 may be provided with means to shield the interior volume of the room 10 from external electromagnetic signals present in the surrounding environment. For example, the interior surfaces 11 of the room 10 can be provided with an electrically conductive wire mesh which is coupled to an earth ground 5, thus electromagnetically isolating the device 20 from the external environment for testing purposes. The device 20 is coupled by a measurement line 21 to appropriate measurement instruments 22 to test the susceptibility of the device 20 to radio-frequency noise or EMI.

Radio-frequency noise or EMI is provided by a plurality of active field radiating elements 30 arranged on the interior surfaces 11 of the room 10, for example, the ceiling 12, the walls 13, and that part of the floor 14 not occupied by the device 20. Each of the elements 30 is shaped, for example, generally rectangularly, and the elements 30 are arranged on the surfaces 11 tile-like, that is, generally close to one and another. The number of elements 30 and spacing therebetween can vary with the size of the room 10, and the degree of homogeneity desired in the generated field. A room 10 large enough to test, for example, a complete computer system may include hundreds of such elements 30. Each of the elements 30 is coupled to a common power bus 40, a common control bus 41 and a common signal bus 42.

The power bus 40 is connected to a conventional power source 50 for the purpose of electrically operating the elements 30. The control bus 41 is connected to a controller 51 which is, for example, a general computer system. The controller 51 provides predetermined digital control signals for each of the individual radiating elements 30. The signal bus 42 is connected to a radio-frequency signal generator 52 capable of generating, for example, sinusoidal waves of varying frequencies in, for example, the radio-frequency range. In the preferred embodiment, for reasons that will become apparent, the signal generator 52 generates, and the signal bus 42 carries a first sinuous signal ($\sin \omega t$) 48 and a second quadrature signal ($\cos \omega t$) 49. That is, the two signals 48 and 49 are ninety degrees out of phase with respect to each other. The power source 50 and the signal generator 52 are coupled to the controller 51 by lines 60 and 61 respectively.

Although the power, control, and signal buses, 40, 41, and 42 respectively, are shown in FIG. 1 as discrete lines exterior to the room 10, alternative bus configurations are possible. For example, the buses 40, 41, and 42 can be etched directly on the circuit board 31. Conventional circuit board edge connectors, not shown, can be provided to mechanically attach the boards 31 to each other, as well as electrically interconnecting the buses 40, 41, and 42 on the various boards 31, thereby reducing the need for external cabling.

Figure 2:
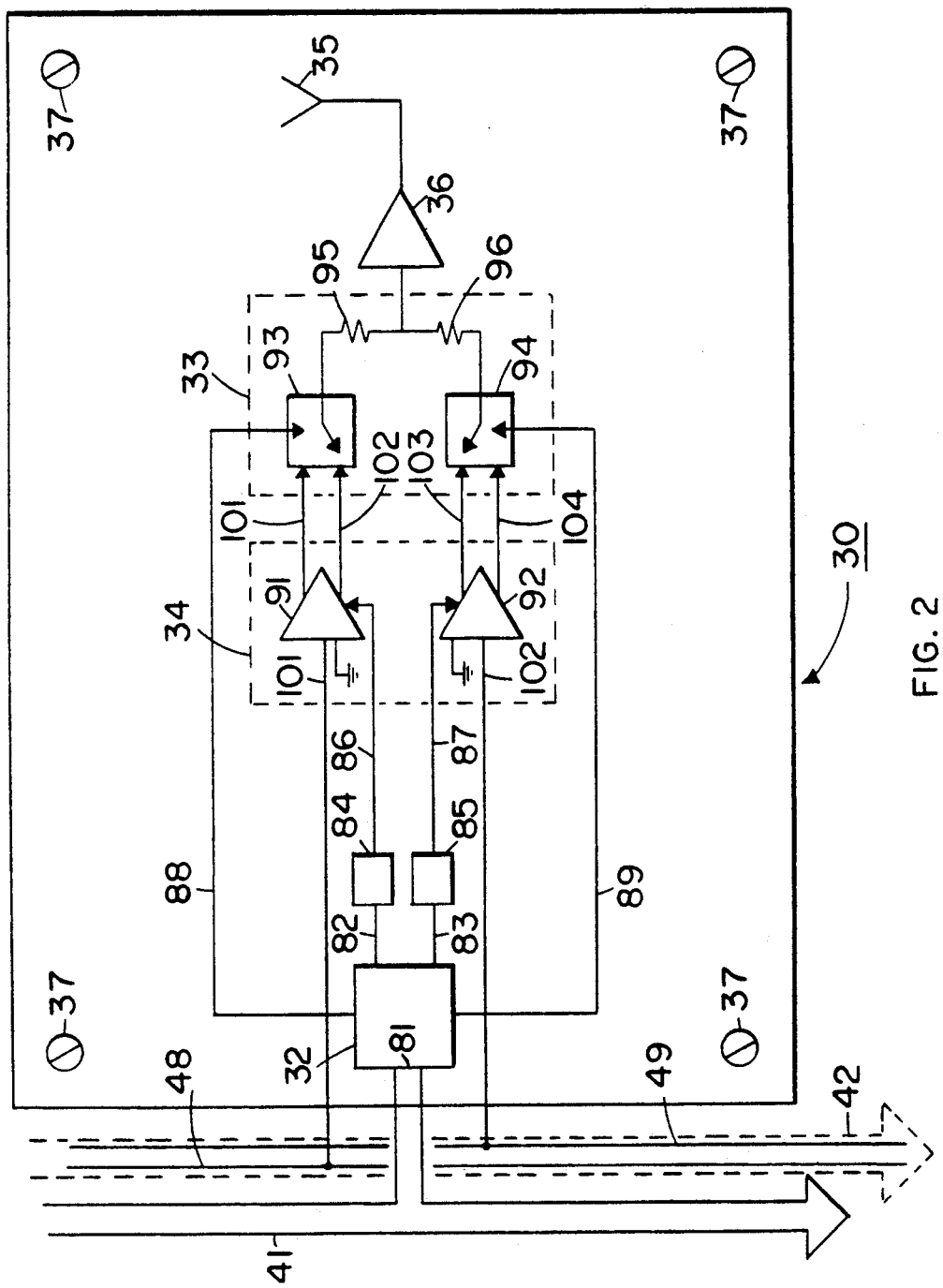
FIG. 2 is block schematic diagram of a radiating element for use with the room of FIG. 1.

Now also with reference to FIG. 2, a preferred embodiment of the radiating elements 30 will be described in further detail. Each radiating element 30 comprises for example, a bus interface 32, a digitally controllable phase shifter 33, a digitally controllable amplifier 34, an antenna 35, and an optical power amplifier 36. The input 81 of the bus interface 32 is connected to the control bus 41 for the purpose of receiving digital control signals from the controller 51 of FIG. 1. The bus interface 32 can include non-conductive optical coupling means, such as photo-diode circuits and fiber optic cables, for electrically isolating each of the radiating elements 30 from one and another.

Two of the outputs, 82 and 83, of the bus interface 32 are connected to conventional digital-to-analog convertors 84 and 85, respectively. The outputs 86 and 87 of the D/A convertors 84, 85 are connected to the amplifier 34 for carrying gain control signals. Two other outputs, 88 and 89, of the bus controller 32 are connected to phase shifter 33 for carrying phase control signals. As described in further detail below, the input side of the amplifier 34 is connected to the signal bus 42, and the output of the amplifier 34 is connected to the phase shifter 33. The output of the phase shifter 33 is connected, via the optional power amplifier 36, to the antenna 35.

The antenna 35 is, for example, part of an etched area of a circuit board 31 on which the bus controller 32, the phase shifter 33 and amplifier 34 are also mounted. The antenna 35 is geometrically dimensioned to be small compared to the wavelength of the radio-frequency signal, for example, to 1/10 or 1/20 of the wavelength of the selected frequency range. The circuit board 31 includes mounting means 37, by way of example studs, screws, or the like, to position the radiating elements 30 on the interior surfaces 11 of the room 10. The optional power amplifier 36 can be appropriately selected for gain, power, and frequency ranges of interest for testing the susceptibility to EMI of the device 20.

The phase shifter 33 and the amplifier 34 are implemented as follows. The amplifier 34 includes an identical first and second wide band RF variable gain amplifier (VGA), VGA1 91 and VGA2 92 connected in parallel. A suitable VGA is, for example, the Signetics NE5209, which is a linear broadband RF amplifier. The gain of the VGA is controlled by a single DC voltage, and the output of the VGA is differential. The input Vin1 101 of VGA1 91 is connected to the first sinus signal 48, and the input Vin2 102 of VGA2 92 is connected to the second quadrature signal 49, both carried on the signal bus 42. The DC gain control voltages for VGA1 91 and VGA2 92 are supplied by the outputs 86 and 87 of the first and second D/A convertors 84 and 85, respectively.

The phase shifter 33 includes an identical first and second wideband single pole double throw (SPDT) RF switch, SPDT1 93 and SPDT2 94, connected in series with the first and second amplifiers VGA1 91 and VGA2 92, respectively. A suitable switch is, for example, the Signetics NE630, which can be activated by a CMOS/TTL compatible digital signal. The two inputs to SPDT1 93 are connected to the differential outputs of VGA1 91 by lines 101 and 102. Likewise, the two inputs of SPDT2 94 are connected to the differential outputs of VGA2 92 by lines 103 and 104. SPDT1 93 and SPDT2 94 are activated by control signals received via the bus interface 32 over lines 88 and 89, respectively. The outputs of SPDT1 93 and SPDT2 94 are connected to each other via two 50 ohm summing resistors 95 and 96, and via the optional power amplifier 36, to the antenna 35.

During operation of the radiating element 30, one side, that is, VGA1 91 and SPDT 93 processes the first sinus signal ($\sin \omega t$) 48 of the signal generator 52. The other side, that is, VGA2 92 and SPDT 94 processes the second quadrature (being in opposite phase) signal ($\cos \omega t$) 49 of the signal generator 52. The variable gain amplifiers VGA1 91 and VGA2 92 are each set for gain by the controller 51 sending appropriate gain control signals. The RF switches SPDT1 93 and SPDT2 94 are each set for appropriate polarity by the controller 51 sending phase control signals to select one or the other of the differential outputs of amplifiers 91 and 92. Thus, the input to the power amplifier 36 can be expressed as:

$$\pm A(\sin \omega t) \pm B(\cos \omega t) = (A^2 + B^2)^{\frac{1}{2}} \cdot (\sin \omega t + \Phi),$$

where $\Phi = \arctan B/A$, and A and B are the gain programmed for amplifiers 91 and 92. In this manner, an individual radiating element 30 can be programmed for gain and phase.

During operation of the multi-element susceptibility room 10, the device 20 to be tested for susceptibility to radio-frequency noise or EMI is placed in the room 10 and coupled to measurement equipment 22 by line 21. The controller 51 directs the frequency generator 52 to transmit radio-frequency signals 48, 49 of a predetermined frequency over the signal bus 42 to each of the radiating elements 30. The radio-frequency signals 48, 49 received by each of the radiating elements 30 are generally in the same phase and of equal amplitude. As part of the test set-up procedure, the controller 51 individually adjusts each of the radiating elements 30 in phase and gain to substantially imitate predetermined field boundary conditions as would exist for the electromagnetic environment in which the device 20 is intended to be used, for example, in the far-field region of an interfering source.

By individually controlling the phase and gain, the radio-frequency signal emitted by each of the antennae 35 can be individually adjusted for phase and amplitude by the controller 51 to create predeterminable field boundary conditions at the periphery of the bounded space defined by the radiating elements 30. If the boundary conditions of a given space are defined and controlled as made possible by controlling the individual elements 30 as described above, the electromagnetic behavior of the interior bounded space is defined and can be made to approximately resemble the electromagnetic environment of an actual installation site for the device 20. The control signals that are used to adjust the radiating elements 30 are generated by the controller 51 in accordance with, for example, the model described below, based on the formulae as expressed in "Antenna Engineering Handbook", by Henry Jasik, McGraw-Hill, New York, N.Y., 1961, pages 2—2 and 2-5.

Figure 3:
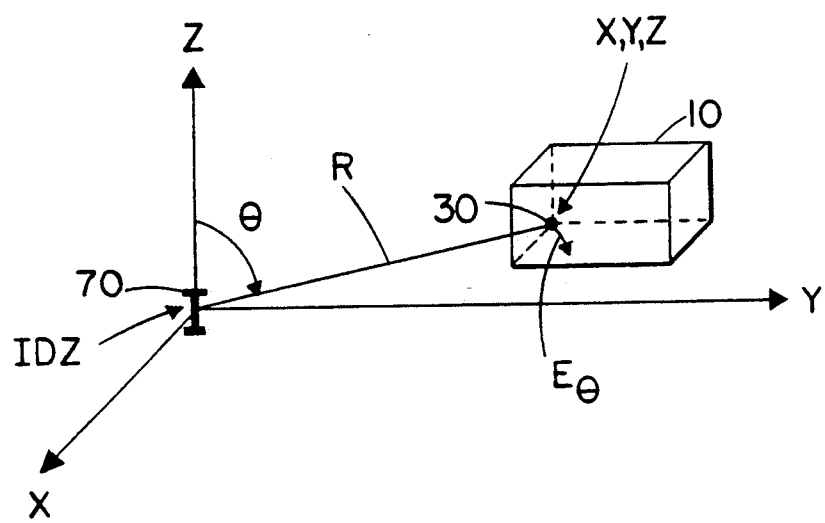
FIG. 3 is a schematic diagram of the field potential in the room of FIG. 1 with respect to the far field region of a radiating source.

With reference to FIG. 3, a first dipole approximation for determining the electric field strength and phase ($E_\theta$), at a location (X,Y,Z) of any of the radiating elements 30, that is, at the periphery of a defined bounded space of room 10, as would be generated by a dipole radio-frequency source 70, at a given frequency and distance R, (in the far field region, where the distance is much greater than the wavelength) can be made by using the following equation:

$$E_\theta = j \frac{30 \beta I dZ}{R} \sin \theta \, e^{-j\beta R}$$

where,
- $E_{74}$ = is the electric field strength in volts per meter;
- $j$ = is $\sqrt{-1}$;
- $\beta$ = is $2\pi/\lambda$;
- IdZ = is the moment of differential current for the source 70, I is given in rms amperes, and dZ is given in meters;
- R = is the distance from the source 70 to the element 30 in meters; and
- $\lambda$ = is the wavelength in meters.

This equation is solved for each of the elements 30, mounted at positions X, Y and Z with respect to the source 70. In other words, if the field-strength is defined, or in this case created, at the boundary of the enclosed surface, such as the interior surface 11 of the multi-element susceptibility room 10, the field pattern inside that boundary is defined. If the appropriate field strength and phase relationships are defined at the boundary as computed above, the field distribution inside the room 10 follows the field strength pattern as would have been created by a source 70, as stipulated above, at the distance R from the room 10. In other words, by appropriately adjusting the individual elements 30, the field inside the room can be made to resemble, for example, the field distribution in the far field region of a radiating source 70.

However, as a practical matter, the interior surfaces 11 of the room will not be completely and uniformly covered with radiating elements 30. For example, some areas of the floor 14 of the room 10 where the device 20 is placed, and where access to the device 20 is provided will probably not have any elements 30 mounted thereon. Therefore, the actual field strength at any location within the room 10, is calculated by determining the field pattern produced by each of the radiating elements 30, and vectorially adding the contribution of each element 30 for each location within the room 10 where the resultant field should be know, such as at the location of the device 20 subjected to the susceptibility test.

Figure 4:
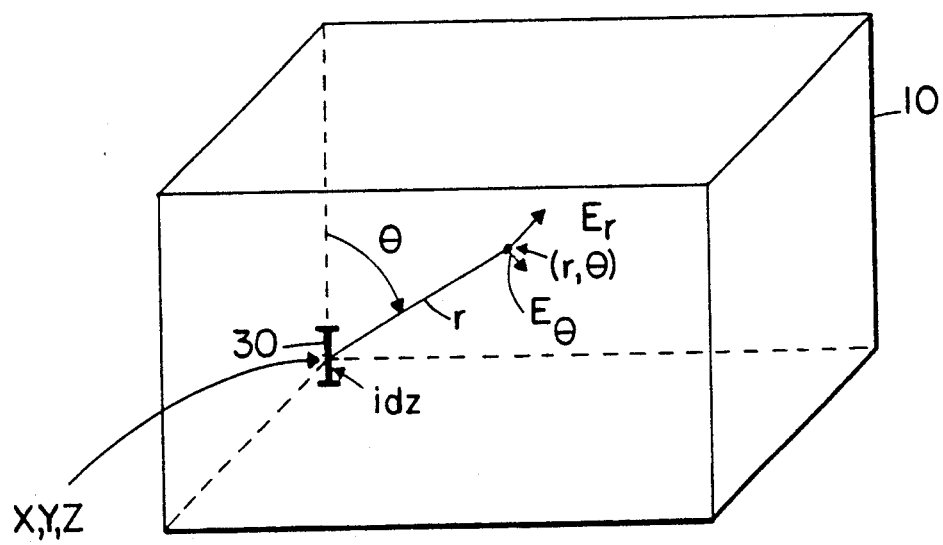
FIG. 4 is a schematic diagram of the contributing field potential at a specific location in the room of FIG. 1 with respect to one of the elements of FIG. 2.

With reference to FIG. 4, according to the dipole approximation, a radiating element 30 at coordinates X, Y, and Z having a source current idz, will produce at location (r, $\theta$) with respect to the element 30, an electric field having a tangential component $E_\theta$, and a radial component $E_r$ as follows:

$$E_\theta = j 30 \beta^2 idz \left[ \frac{1}{\beta r} - \frac{j}{(\beta r)^2} - \frac{1}{(\beta r)^3} \right] \sin \theta \, e^{-j\beta r}$$

and $$E_r = 60 \beta^2 idz \left[ \frac{1}{(\beta r)^2} - \frac{j}{(\beta r)^3} \right] \cos \theta \, e^{-j\beta r}$$

A vector summation over all of the radiating elements 30 at locations X,Y and Z will provide the electric field strength at various locations r, $\theta$ in the room 10. Likewise, the tangential component of the magnetic field for the radiating elements 30 is given by:

$$H_\theta = j \frac{\beta^2}{4\pi} idz \left[ \frac{1}{(\beta r)} - \frac{j}{(\beta r)^2} \right] \sin \theta \, e^{-j\beta r}$$

It should be obvious to one skilled in the art that the homogeneity or linearity of the field in the vicinity of the device 20 can be further improved by measuring the relative field strength at predetermined points with a probe, and adjusting pre-stored gain and phase control signals generated by the controller 51 accordingly.

Advantages of the multi-element susceptibility room according to the present invention, heretofore unobtainable by the prior art include individual radiating elements 30 which can be made much smaller in size than conventional anechoic absorbers, allowing a much smaller, and therefore lower cost room or area required for immunity testing. Also, since each of the radiating elements is individually programmable, different field impedances can be created, an effect that is not possible with conventional anechoic rooms. Also, since each of the radiating elements 31 has an integrated radio-frequency amplifiers 34, the need for a single high-power amplifier is eliminated. Furthermore, fields with much greater linearity can be created, thus allowing the testing of a device under conditions which closely resemble actual operating environments, such as in the far field region of an interfering source.

While there has been shown and described a preferred embodiment, it is to be understood that various other adaptations and modifications may be made within the spirit and scope of the invention.

What is claimed is:

1. An apparatus for generating a predetermined radio-frequency field within a bounded space, comprising:
   a room having interior surfaces enclosing a bounded space;
   a signal generator for generating radio-frequency signals;
   a programmable controller for generating predetermined phase control signals and predetermined gain control signals;
   a plurality of radiating elements, coupled to said controller and said signal generator, said plurality of radiating elements arranged on said interior surfaces to radiate inwardly into said bounded space, said plurality of radiating elements arranged to cover a substantial portion of said interior surfaces, each of said radiating elements individually responsive to said phase control and gain control signals, for generating a homogeneous radio-frequency field within said bounded space of said room.

2. The apparatus as in claim 1 wherein each of said radiating elements further comprises:
   a phase shifter, responsive to said phase control signals, for shifting the phase of said radio-frequency signals;
   an amplifier, responsive to said gain control signals, for amplifying said radio-frequency signals; and
   an antenna coupled to said phase shifter and said amplifier for radiating said amplified and phase shifted signals; and wherein said bounded space within said interior surfaces is electromagnetically shielded from the external environment.

3. The apparatus as in claim 1 wherein each of said radiating elements further comprises a circuit board, and said phase shifter, said amplifier and said antenna are mounted on said circuit board, said circuit board shaped generally rectangularly.

4. The apparatus as in claim 1 further including a signal bus connecting said radiating elements to said signal generator, a control bus connecting said radiating elements to said programmable controller, and each radiating element further includes a bus interface for coupling said control bus to said amplifier and said phase shifter.

5. The apparatus as in claim 1 wherein said signal bus provides a sinuous signal and a quadrature signal.

6. An arrangement for subjecting an electronic device positioned in a room to a predetermined radio-frequency field, said arrangement comprising:
   a room having interior surfaces enclosing a bounded space;
   means for providing a radio-frequency signal;
   control means for generating predetermined gain control signals and predetermined phase control signals;
   means coupled to said control means and said means for providing a radio-frequency signal, for amplifying said radio-frequency signal to a predetermined amplitude as determined by said gain control signals;
   means coupled to said means for generating a radio-frequency signal and said control means, for shifting the phase of said radio-frequency signals to a predetermined phase; and
   a plurality of antennas arranged on said interior surfaces to radiate inwardly into said bounded space, said antennas spaced to cover a substantial portion of said interior surfaces, said plurality of antennas coupled to said means for amplifying and said means for shifting the phase of said radio-frequency signal, for radiating said amplified and phase shifted signal to subject the electronic device to a homogeneous radio-frequency field.

7. A method for generating a predetermined radio-frequency field within a bounded space, comprising the steps of:
   enclosing a bounded space within interior surfaces of a room;
   determining, for a plurality of locations on said interior surfaces, the field strength of an electromagnetic field that would be generated by a radio-frequency source at a predetermined distance from said interior surfaces, said plurality of locations spaced to cover a substantial portion of said interior surfaces;
   generating a radio-frequency signal;
   arranging, at each of said plurality of locations, a radiating element coupled to said radio-frequency signal, said radiating elements controllable for phase and gain, said radiating element arranged to radiate inwardly into said bounded space;
   controlling the phase and gain of each of said radiating elements at each of said plurality of locations on said interior surfaces to emit a radio-frequency signal corresponding to said determined electromagnetic field.

* * * * *